United States Patent
Jou et al.

(10) Patent No.: US 8,693,237 B2
(45) Date of Patent: Apr. 8, 2014

(54) SINGLE-ENDED SRAM WITH CROSS-POINT DATA-AWARE WRITE OPERATION

(75) Inventors: Shyh-Jye Jou, Hsinchu (TW); Jhih-Yu Lin, Hsinchu (TW); Ching-Te Chuang, Hsinchu (TW); Ming-Hsien Tu, Hsinchu (TW); Yi-Wei Chiu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 49 days.

(21) Appl. No.: 13/562,330

(22) Filed: Jul. 31, 2012

(65) Prior Publication Data
US 2013/0194861 A1 Aug. 1, 2013

(30) Foreign Application Priority Data

Feb. 1, 2012 (TW) .............................. 101103433 A

(51) Int. Cl.
G11C 11/00 (2006.01)
(52) U.S. Cl.
USPC ...................................... 365/154; 365/189.05
(58) Field of Classification Search
None
See application file for complete search history.

(56) References Cited

U.S. PATENT DOCUMENTS

| 6,519,176 | B1 | 2/2003 | Hamzaoglu et al. |
| 6,804,143 | B1 | 10/2004 | Hobson |
| 7,385,840 | B2 * | 6/2008 | Redwine ...................... 365/154 |
| 7,420,840 | B2 * | 9/2008 | Jin ........................... 365/185.05 |
| 7,613,052 | B2 | 11/2009 | Van Winkelhoff et al. |
| 7,813,163 | B2 | 10/2010 | Pille et al. |
| 8,259,510 | B2 * | 9/2012 | Chuang et al. ........... 365/189.05 |
| 2007/0242513 | A1 | 10/2007 | Chang et al. |
| 2010/0309740 | A1 | 12/2010 | Arsovski et al. |

OTHER PUBLICATIONS

Yang et al., "A Low-Power Low-Swing Single-Ended Multi-Port SRAM," International Symposium on VLSI Design, Automation and Test, 2007, pp. 1-4.
Kim et al., "Asymmetrical SRAM Cells with Enhanced Read and Write Margins," International Symposium on VLSI Technology, Systems and Applications, 2007, pp. 1-2.
Richard F. Hobson, "A New Single-Ended SRAM Cell With Write-Assist," IEEE Transactions on Very Large Scale Integration (VLSI) Systems 15(2), Feb. 2007, pp. 173-181.
Verma et al., "A 65nm 8T Sub-Vt SRAM Employing Sense-Amplifier Redundancy," IEEE International Solid-State Circuits Conference Digest of Technical Papers, 2007, pp. 328-606.

(Continued)

*Primary Examiner* — Tan T. Nguyen
(74) *Attorney, Agent, or Firm* — Jianq Chyun IP Office

(57) ABSTRACT

A single-ended SRAM including at least one memory cell and a third switch is provided. The memory cell includes a data-latching unit, a first switch, a second switch and a data-transferring unit. The data-latching unit is configured for latching the received input data and provides a storage data and the inverse data of the storage data. The first switch transfers a reference data to the data-latching unit according to a first word-line signal. The second switch transfers the reference data to the data-latching unit according to a second word-line signal. The data-transferring unit decides whether or not to transfer the reference data to the bit-line according to the storage data and a control signal. The third switch receives the reference data and the control signal and transfers the reference data to the first switch, the second switch and the data-transferring unit according to the control signal.

10 Claims, 4 Drawing Sheets

(56) References Cited

OTHER PUBLICATIONS

Chang et al., "A 32kb 10T Subthreshold SRAM Array with Bit-Interleaving and Differential Read Scheme in 90nm CMOS," IEEE International Solid-State Circuits Conference Digest of Technical Papers, 2008, pp. 388-622.

Chiu et al., "8T Single-ended Sub-threshold SRAM with Cross-Point Data-aware Write Operation," 2011 International Symposium on Low Power Electronics and Design (ISLPED), Aug. 1-3, 2011, pp. 169-174.

Jihi-Yu Lin, "Design and Implementation of Low Voltage SRAM," Master's Thesis, 2009, National Chiao Tung University, Department of Electronics Engineering & Institute of Electronics.

* cited by examiner

SINGLE-ENDED SRAM WITH CROSS-POINT DATA-AWARE WRITE OPERATION

CROSS-REFERENCE TO RELATED APPLICATION

This application claims the priority benefit of Taiwan application serial no. 101103433, filed on Feb. 1, 2012. The entirety of the above-mentioned patent application is hereby incorporated by reference herein and made a part of this specification.

BACKGROUND OF THE INVENTION

1. Field of the Invention

The invention generally relates to a single-ended static random access memory (single-ended SRAM), and more particularly, to a single-ended SRAM able to cross-point data-aware write data operated at a sub-threshold low-voltage.

2. Description of Related Art

The science and technology about computer today are developing faster and faster, in which the memory technology closely related to the computer science and technology plays a vital key role. According to whether or not the data is kept or deleted after the power is off, the memory is divided into non-volatile memory and volatile memory. For the non-volatile memory, the data can be kept after the power is off, while for the volatile memory, the saved data is deleted after the power is off. Further, the volatile memory is divided into dynamic random access memory (DRAM) and static random access memory (SRAM).

FIG. 1 is a schematic circuit diagram of a conventional SRAM, in which a SRAM 100 includes six transistors M1, M2, M3, M4, M5 and M6. The transistors M1, M2, M3 and M4 are coupled between a reference power Vcc and a reference ground GND and form two inverters connected in series to each other. The gates of the transistors M6 and M5 respectively receive a word-line signal WWL and a word-line signals WRL, while the sources (or drains) of the transistors M5 and M6 respectively coupled to a bit-line BWL and a bit-line BRL.

The SRAM 100 is a single-ended writing/reading SRAM, in which the data to be written can be written into a data-latching unit formed by the transistors M1-M4 via the transistor M5 through the bit-line BWL. The transistor M6 and the bit-line BRL provide the SRAM 100 with a data-reading path.

In the SRAM 100, in order to smoothly conduct the above-mentioned single-ended writing operation, the channel aspect ratio (ratio of channel width over channel length) of the transistor M5 should be sufficient for providing enough current driving capacity. However, such requirement unavoidably increases the circuit area of the SRAM 100 and leads to higher fabrication cost.

SUMMARY OF THE INVENTION

Accordingly, the invention is directed to a single-ended SRAM able to reduce the possibly produced leak current of the memory cell thereof and increase the noise margin of reading/writing data.

The invention provides a single-ended SRAM, which includes at least one memory cell and a third switch. The memory cell includes a data-latching unit, a first switch, a second switch and a data-transferring unit. The data-latching unit has a first input-terminal, a second input-terminal, a first output-terminal and a second output-terminal. The data-latching unit is configured for latching an input data received by the first input-terminal or the second input-terminal, and respectively at the first output-terminal and the second output-terminal provides a storage data and the inverse data of the storage data. The first switch receives a reference data and is coupled to the second input-terminal, in which the first switch makes the reference data transferred to the second input-terminal according to a first word-line signal. The second switch receives the reference data and is coupled to the first input-terminal, in which the second switch makes the reference data transferred to the first input-terminal according to a second word-line signal. The data-transferring unit is coupled to a bit-line and the first output-terminal and decides whether or not to transfer the reference data to the bit-line according to the storage data and a control signal. The third switch receives the reference data and the control signal, is coupled to the first switch, the second switch and the data-transferring unit, and transfers the reference data to the first switch, the second switch and the data-transferring unit according to the control signal.

Based on the description above, when the memory cell of the single-ended SRAM is going to be written by data, the single-ended SRAM provided by the invention, by disposing the third switch and by turning on the third switch, is able to make the reference data as an input data transferred to the first or the second input-terminal of the memory cell so as to write the data into the memory cell. In addition, for the memory cells unselected to be read/written, the third switches connected by the unselected memory cells would be turned off, so that the possible current-leaking paths are cut off.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
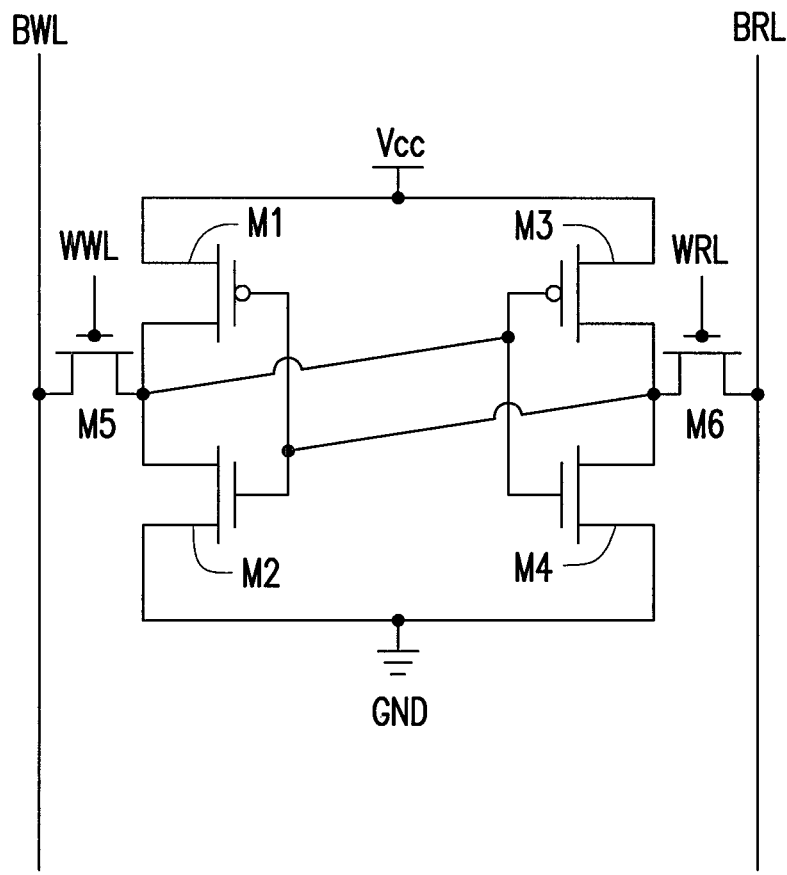
FIG. 1 is a schematic circuit diagram of a conventional single-ended SRAM.
Figure 2:
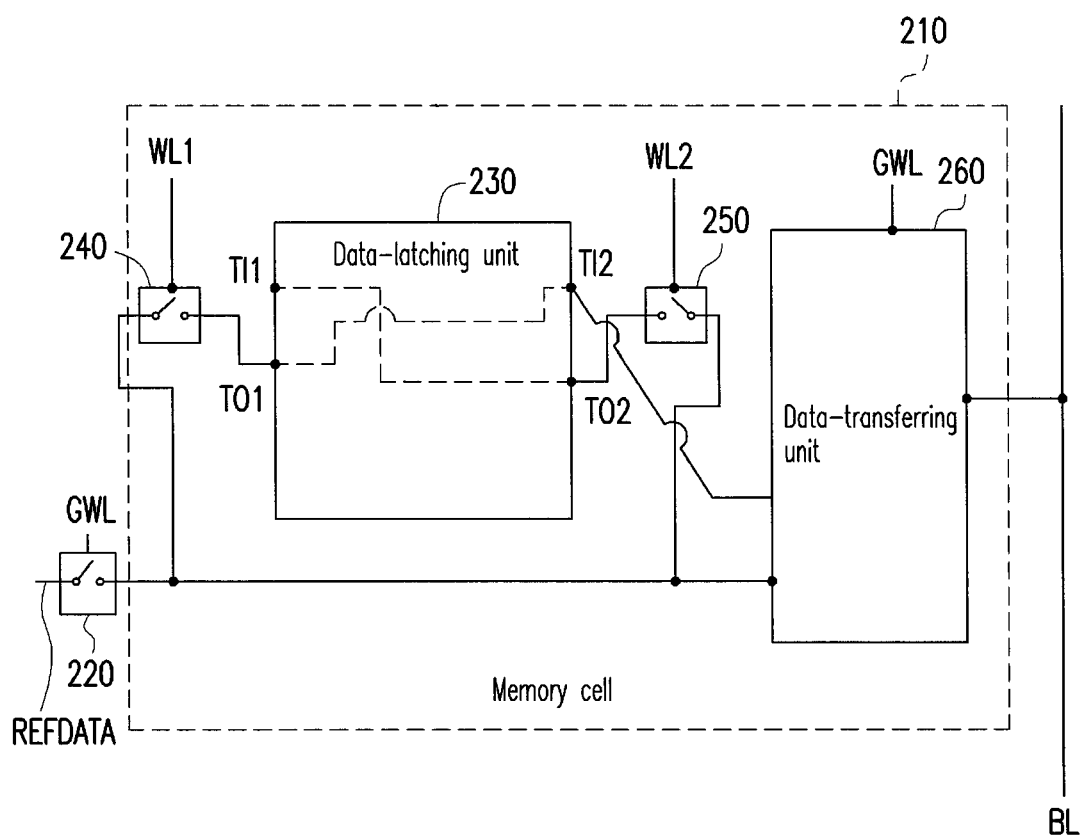
FIG. 2 is a schematic diagram of a single-ended SRAM according to an embodiment of the invention.

FIG. 2 is a schematic diagram of a single-ended SRAM according to an embodiment of the invention. Referring to FIG. 2, a single-ended SRAM 200 includes a memory cell 210 and a third switch 220. The memory cell 210 includes a data-latching unit 230, a first switch 240, a second switch 250 and a data-transferring unit 260. The data-latching unit 230 has two input-terminals TI1 and TI2 and two output-terminals TO1 and TO2. The first switch 240 receives a reference data REFDATA and is coupled to the input-terminal TI2. The second switch 250 receives the reference data REFDATA and is coupled to the input-terminal TI1. The data-transferring unit 260 is coupled to a bit-line BL and the output-terminal TO1. The third switch 220 receives the reference data REFDATA and a control signal GWL and is coupled to the first switch 240, the second switch 250 and the data-transferring unit 260. Wherein, the single-ended SRAM 200 is a single-ended Sub-threshold SRAM.

When the memory cell 210 of the single-ended SRAM 200 conducts a data-writing operation, first, the third switch 220 is turned on through the control signal GWL and the reference data REFDATA is transferred to the first switch 240, the second switch 250 and the data-transferring unit 260 via the third switch 220. And, the first switch 240 is turned on through a word-line signal WL1 so as to decide whether or not to transfer the reference data REFDATA as an input data to the input-terminal TI2; or the second switch 250 is turned on through a word-line signal WL2 so as to decide whether or not to transfer the reference data REFDATA as an input data to the input-terminal TI1. The memory cell 210 locks the input data come from the first input-terminal TI1 or the second input-terminal TI2 and respectively at the first output-terminal TO1 and the second output-terminal TO2 thereof provides a storage data and the inverse data of the storage data according to the input data. It should be noted that during writing data on the memory cell 210, only one of the first switch 240 and the second switch 250 is turned on, while during latching the input data come from the input-terminal TI1 by the memory cell 210, the logic level of the storage data provided by the output-terminal TO2 is the same as the input data. During latching the input data come from the input-terminal TI1 by the memory cell 210, the logic level of the storage data provided by the output-terminal TO1 is the same as the inverse data of the input data.

When the memory cell 210 of the single-ended SRAM 200 conducts a data-reading operation, first, the third switch 220 is turned on through the control signal GWL and the reference data REFDATA is transferred to the first switch 240, the second switch 250 and the data-transferring unit 260 via the third switch 220. And, the first switch 240 and the second switch 250 are turned off through the word-line signal WL1 and a word-line signal WL2 so that the reference data REFDATA would not be transferred to the data-latching unit 230 via the first switch 240 or the second switch 250. That is to say, when the memory cell 210 conducts a data-reading operation, the storage data saved in the data-latching unit 230 would not be revised. Meanwhile, the memory cell 210 provides the storage data to the data-transferring unit 260 through the output-terminal TO1, and the data-transferring unit 260 would decide whether or not to transfer the reference data REFDATA to the bit-line BL according to the received control signal GWL and the storage data.

In the embodiment, the reference data REFDATA is, for example, equal to a reference grounding voltage on the reference ground GND. When the data-transferring unit 260 decides to transfer the reference data REFDATA (reference grounding voltage) to the bit-line BL, the read data from the memory cell 210 is equal to the logic signal "0". On the contrary, when the data-transferring unit 260 decides not to transfer the reference data REFDATA to the bit-line BL, the logic level on the bit-line BL would keep the logic high-level voltage which is presented during a pre-charge operation occurred prior to conducting a data-reading operation by the memory cell 210; i.e., the read out data from the memory cell 210 at the time is equal to the logic signal "1".

Figure 3:
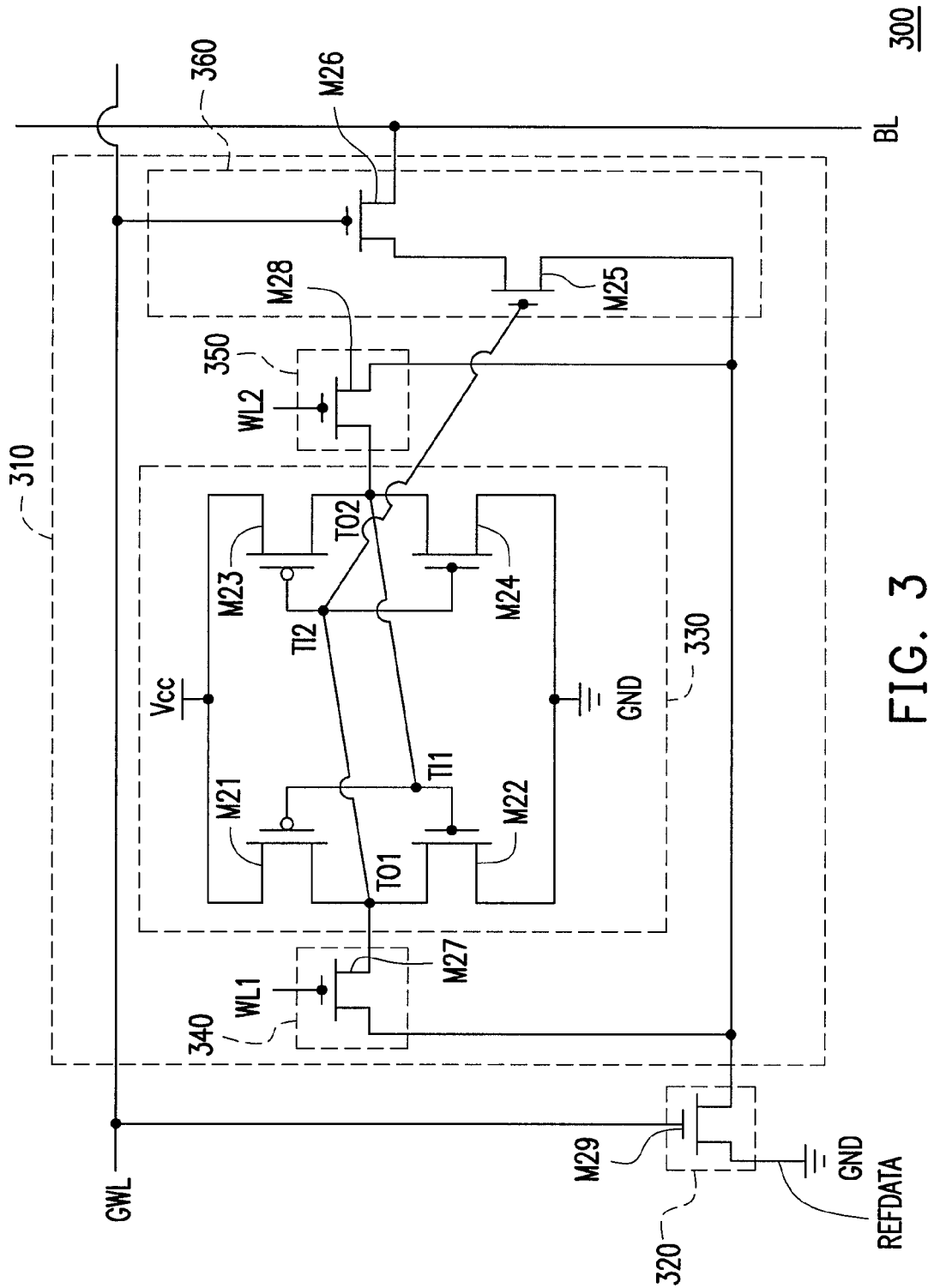
FIG. 3 is a schematic diagram of a single-ended SRAM according to another embodiment of the invention.

FIG. 3 is a schematic diagram of a single-ended SRAM according to another embodiment of the invention. In the embodiment of FIG. 3, a data-latching unit 330 includes four transistors M21, M22, M23 and M24. The first terminal (for example, source) of the transistor M21 receives a reference power Vcc, the second terminal (for example, drain) of the transistor M21 is coupled to the output-terminal TO1 and the control terminal (for example, gate) of the transistor M21 is coupled to the input-terminal TI1. The first terminal (for example, drain) of the transistor M22 is coupled to the output-terminal TO1, the second terminal (for example, source) of the transistor M22 is coupled to the reference ground GND and the control terminal (for example, gate) of the transistor M22 is coupled to the input-terminal TI1. The first terminal (for example, source) of the transistor M23 receives the reference power Vcc, the second terminal (for example, drain) of the transistor M23 is coupled to the output-terminal TO2 and the control terminal (for example, gate) of the transistor M23 is coupled to the input-terminal TI2. The first terminal (for example, drain) of the transistor M24 is coupled to a second output-terminal TO2, the second terminal (for example, source) of the transistor M24 is coupled to the reference ground GND and the control terminal (for example, gate) of the transistor M24 is coupled to the input-terminal TI2. In the embodiment, the transistors M21 and M23 are P-type transistors and the transistors M22 and M24 are N-type transistors.

A data-transferring unit 360 includes two transistors M25 and M26. The control terminal (for example, gate) of the transistor M25 is coupled to the output-terminal TO1 to receive the storage data. The second terminal (for example, source) of the transistor M25 is coupled to the third switch 220. The first terminal (for example, source) of the transistor M26 is coupled to the first terminal (for example, drain) of the transistor M25, the second terminal (for example, drain) of the transistor M26 is coupled to the bit-line BL and the control terminal (for example, gate) of the transistor M26 receives the control signal GWL.

In the embodiment, the first switch 340 is a transistor M27, the first terminal (for example, source) of the transistor M27 receives the reference data REFDATA, the second terminal (for example, drain) of the transistor M27 is coupled to input-terminal TI1 and the control terminal (for example, gate) of the transistor M27 receives the word-line signal WL1. The second switch 350 is a transistor M28, the first terminal (for example, source) of the transistor M28 receives the reference data REFDATA, the second terminal (for example, drain) of the transistor M28 is coupled to input-terminal TI2 and the control terminal (for example, gate) of the transistor M28 receives the word-line signal WL2.

In addition, the third switch 320 is a transistor M29, the first terminal (for example, source) of the transistor M29 receives the reference data REFDATA, the second terminal (for example, drain) of the transistor M29 is coupled to the first switch 340 and the second switch 350 and the data-transferring unit 360, and the control terminal (for example, gate) of the transistor M29 receives the control signal GWL.

In the embodiment, the voltage level of the reference data REFDATA can be equal to the voltage level on the reference ground GND and when the third switch 320 is turned off, the connection lines between the transistor M29 and the transistor M27, the transistor M28 and the transistor M25 are in virtual-grounding state.

When conducting a writing operation of the data corresponding to a logic signal "1" on the memory cell 310 of the single-ended SRAM 300, first, the voltage level of the control signal GWL coupled to the gate of the transistor M29 is given as a logic high-level voltage so as to turn on the transistor M29 and the voltage level on the word-line signal WL1 coupled to the gate of the transistor M27 is given as a logic high-level voltage so as to turn on the transistor M27. In this way, the reference ground GND coupled to the source of the transistor M29 would pull down the voltage level of the drain of the transistor M27 and the voltage levels of the input-terminal TI2 and the gate of the transistor M23. Since the transistor M23 is a P-type transistor, the transistor M23 would be turned on. As a result, the reference power Vcc would charge the output-terminal TO2 through the transistor M23 to make the voltage level thereof a logic high-level voltage. At the time, the voltage level on the word-line signal WL2 coupled to the gate of the transistor M28 is equal to the reference grounding voltage on the reference ground GND to turn off the transistor M28 so as to maintain the voltage level of the output-terminal TO2. Meanwhile, the voltage level of the output-terminal TO1 is equal to the reference grounding voltage on the reference ground GND.

When conducting a writing operation of the data corresponding to a logic signal "0" on the memory cell 310 of the single-ended SRAM 300, first, the voltage level of the control signal GWL coupled to the gate of the transistor M29 is given as a logic high-level voltage so as to turn on the transistor M29 and the voltage level on the word-line signal WL1 coupled to the gate of the transistor M28 is given as a logic high-level voltage so as to turn on the transistor M28. In this way, the reference ground GND coupled to the source of the transistor M29 would pull down the voltage level of the drain of the transistor M28 and the voltage levels of the input-terminal TI1 and the gate of the transistor M21. As a result, the reference power Vcc would charge the output-terminal TO1 through the turned-on transistor M21 to make the voltage level thereof a logic high-level voltage. In the same way, the voltage level on the word-line signal WL1 coupled to the gate of the transistor M27 is equal to the reference grounding voltage on the reference ground GND to turn off the transistor M27 at the time so as to maintain the voltage level of the output-terminal TO1. Meanwhile, the voltage level of the output-terminal TO2 is equal to the reference grounding voltage on the reference ground GND.

Prior to conducting a reading operation on the memory cell 310 of the single-ended SRAM 300, the bit-line BL is precharged to make the voltage level thereof a logic high-level voltage. After finishing the reading operation, if the voltage level on the bit-line BL is still the logic high-level voltage, it can be easily judged that the data read from the memory cell 310 is equal to the logic signal "1". After finishing the reading operation, if the voltage level on the bit-line BL is a logic low-level voltage, it can be easily judged that the data read from the memory cell 310 is equal to the logic signal "0".

When conducting a reading operation on the memory cell 310 of the single-ended SRAM 300, first, the voltage level of the control signal GWL coupled to the gates of the transistors M29 and M26 is given as a logic high-level voltage so as to turn on the transistors M29 and M26; the voltage levels on the word-line signals WL1 and WL2 respectively coupled to the gates of the transistors M27 and M28 are given equal to the reference grounding voltage on the reference ground GND so as to turn off the transistors M27 and M28, which functions to prevent the charges stored in the memory cell 310 from being lost from the transistor M27 or M28.

If the voltage level of the output-terminal TO2 is the logic high-level voltage and the voltage level of the output-terminal TO1 is equal to the reference grounding voltage on the reference ground GND, due to the coupling between the gate of the transistors M25 and the output-terminal TO1, the transistors M25 is turned off. At the time, the charges on the bit-line BL are unable to be transferred to the reference ground GND via the transistor M25, so that the voltage level of the bit-line BL is kept on the logic high-level voltage and the data read from the memory cell 310 should be equal to the logic signal "1".

If the voltage level of the output-terminal TO2 is equal to the reference grounding voltage on the reference ground GND and the voltage level of the output-terminal TO1 is the logic high-level voltage, due to the coupling between the gate of the transistors M25 and the output-terminal TO1, the transistors M25 is turned on. At the time, the transistor M26 is in turned-on state as well, so that the charges on the bit-line BL are able to flow to the reference ground GND via the path formed by the turned-on transistors M25, M26, M29 so that the voltage level of the bit-line BL is lower down to the logic low-level voltage and the data read from the memory cell 310 should be equal to the logic signal "0".

Since the transistors M29, M25 and M26 are coupled in serial, a leakage current on the bit-line BL can be reduced, such as that a read ability of the single-ended SRAM 300 is increased.

Figure 4:
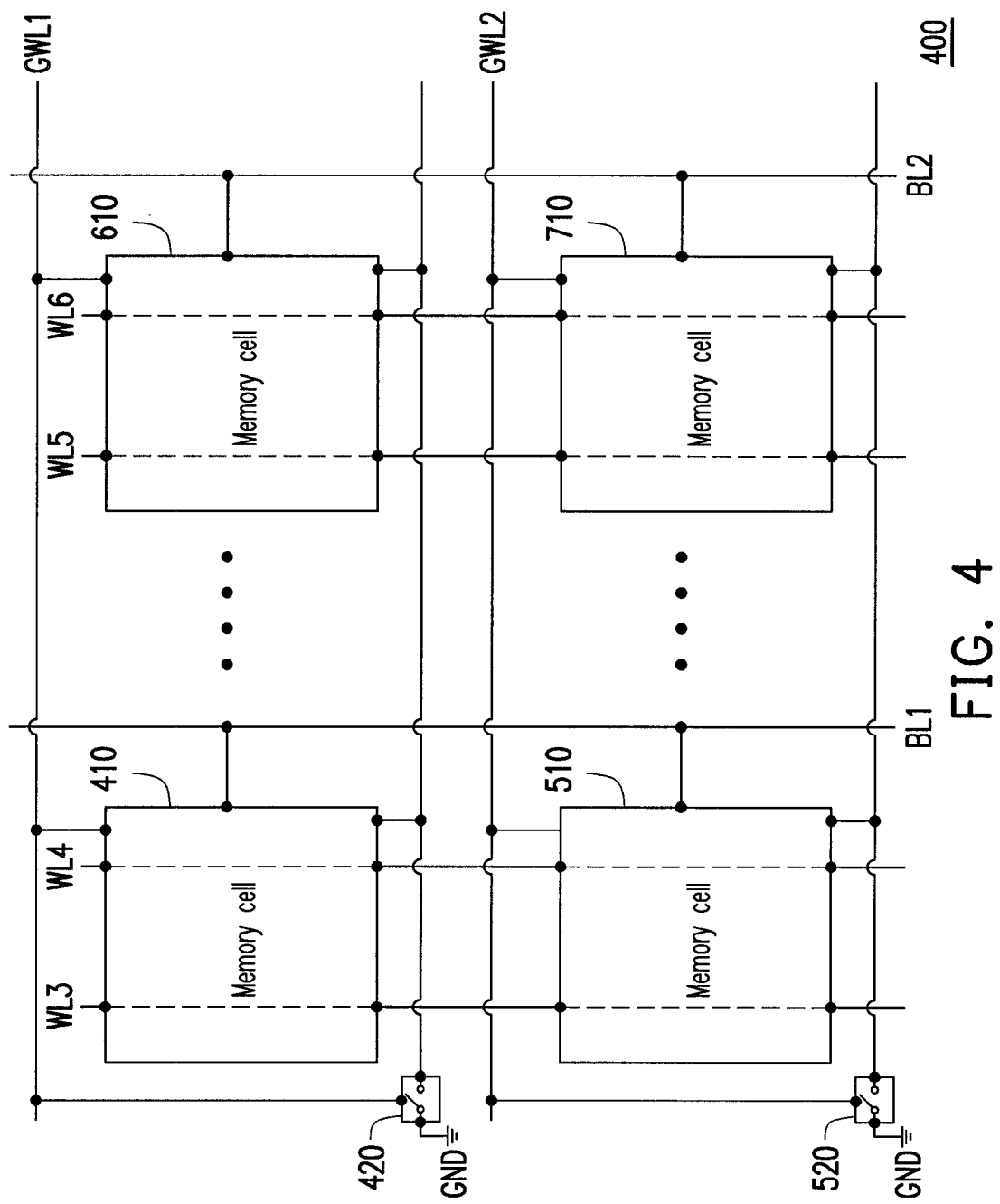
FIG. 4 is a schematic diagram of a single-ended SRAM according to yet another embodiment of the invention.

FIG. 4 is a schematic diagram of a single-ended SRAM according to yet another embodiment of the invention. A single-ended SRAM 400 in FIG. 4 has at least four memory cells 410, 510, 610 and 710. The internal circuit architecture of the memory cells is the same as the memory cell 310 in the embodiment of FIG. 3. The bit-line BL1 is coupled to the memory cells 410 and 510, while the bit-line BL2 is coupled to the memory cells 610 and 710. The word-line signals WL3 and WL4 are respectively coupled to the memory cells 410 and 510, while the word-line signals WL5 and WL6 are respectively coupled to the memory cells 610 and 710.

One terminal of the third switch 420 is coupled to the memory cells 410 and 610 and the other terminal of the third switch 420 is connected to the reference ground GND. The control signal GWL1 controls the third switch 420 for turning on it. When conducting a writing operation of data on the memory cell 410 or 610, the control signal GWL1 turns on the third switch 420 to make the memory cell 410 or 610 discharge onto the reference ground GND to finish the writing operation. When conducting a reading operation of data on the memory cell 410 or 610, the control signal GWL1 turns on the third switch 420, so that it is decided according to the data stored in the memory cell 410 or 610 whether or not the bit-line BL1 or BL2 discharge onto the reference ground GND to finish the reading operation. If the memory cells 410 and 610 are not selected for the reading/writing operation, the control signal GWL1 turns off the third switch 420 to cut off the connection paths between the memory cells 410 and 610 and the reference ground GND. At the time, one terminal of the third switch 520 is coupled to the memory cells 510 and 710 and the other terminal of the third switch 520 is connected to the reference ground GND. The control signal GWL2 controls the third switch 520 for turning on it. The function of the third switch 520 on the memory cells 510 and 710 is the same as the third switch 420.

When conducting a writing operation on the memory cell 410 only, the control signal GWL1 turns on the third switch 420 and the voltage level of the word-line signal WL3 or WL4 is the logic high-level voltage. Since the memory cells 410 and 510 share the word-line signals WL3 and WL4, the data stored in the memory cell 510 may be changed. At the time, the control signal GWL2 is used to turn off the third switch 520 so that the connection path between the memory cell 510 and the reference ground GND is cut off. As a result, the possible current-leaking of the bit-line of the memory cell 510 is reduced.

In summary, when the memory cell of the single-ended SRAM is going to be written by data, the single-ended SRAM provided by the invention can turn on the third switch to provide a discharge path for the memory cell so as to write the data into the memory cell. When a memory cell is not selected for reading/writing operation, the third switches is turned off to cut off the current-leaking path of the unselected memory cell. In short, the invention can suppress the current-leaking of the bit-line of the single-ended SRAM. Furthermore, a read static noise margin of the single-ended SRAM provided by the invention can be improved.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A single-ended static random access memory, comprising:
   at least one memory cell, comprising:
   a data-latching unit, having a first input-terminal, a second input-terminal, a first output-terminal and a second output-terminal, latching an input data received by the first input-terminal or the second input-terminal, and providing a storage data and the inverse data of the storage data at the first output-terminal and the second output-terminal respectively;
   a first switch, receiving a reference data and the first switch coupled to the second input-terminal, wherein the first switch makes the reference data transferred to the second input-terminal according to a first word-line signal;
   a second switch, receiving the reference data and the second switch coupled to the first input-terminal, wherein the second switch makes the reference data transferred to the first input-terminal according to a second word-line signal; and
   a data-transferring unit, coupled to a bit-line and the first output-terminal and the data-transferring unit deciding whether to transfer the reference data to the bit-line or not according to the storage data and a control signal; and
   a third switch, receiving the reference data and the control signal, the third switch coupled to the first switch, the second switch and the data-transferring unit, and transferring the reference data to the first switch, the second switch and the data-transferring unit according to the control signal.

2. The memory cell of the single-ended static random access memory as claimed in claim 1, wherein the data-latching unit comprises:
   a first transistor, having a first terminal, a second terminal and a control terminal, wherein the first terminal receives a reference power, the second terminal is coupled to the first output-terminal and the control terminal is coupled to the first input-terminal;
   a second transistor, having a first terminal, a second terminal and a control terminal, wherein the first terminal is coupled to the first output-terminal, the second terminal is coupled to a reference ground and the control terminal is coupled to the first input-terminal;
   a third transistor, having a first terminal, a second terminal and a control terminal, wherein the first terminal receives a reference power, the second terminal is coupled to the first output-terminal and the control terminal is coupled to the first input-terminal;
   a fourth transistor, having a first terminal, a second terminal and a control terminal, wherein the first terminal is coupled to the first output-terminal, the second terminal is coupled to a reference ground and the control terminal is coupled to the first input-terminal,
   wherein the first output-terminal is coupled to the second input-terminal and the second output-terminal is coupled to the first input-terminal.

3. The memory cell of the single-ended static random access memory as claimed in claim 2, wherein the first transistor and the third transistor are P-type transistors and the second transistor and the fourth transistor are N-type transistors.

4. The memory cell of the single-ended static random access memory as claimed in claim 1, wherein the data-transferring unit comprises:
   a fifth transistor, having a first terminal, a second terminal and a control terminal, wherein the control terminal is coupled to the first output-terminal to receive the storage data and the second terminal is coupled to the third switch; and
   a sixth transistor, having a first terminal, a second terminal and a control terminal, wherein the first terminal is coupled to the first terminal of the fifth transistor, the second terminal of the sixth transistor is coupled to the bit-line and the control terminal of the sixth transistor receives the control signal.

5. The memory cell of the single-ended static random access memory as claimed in claim 1, wherein the first switch is a seventh transistor, the seventh transistor has a first terminal, a second terminal and a control terminal, wherein the first terminal receives the reference data, the second terminal is coupled to the second input-terminal and the control terminal receives the first word-line signal.

6. The memory cell of the single-ended static random access memory as claimed in claim 1, wherein the second switch is an eighth transistor, the eighth transistor has a first terminal, a second terminal and a control terminal, wherein the first terminal of the eighth transistor receives the reference data, the second terminal is coupled to the first input-terminal and the control terminal receives the second word-line signal.

7. The memory cell of the single-ended static random access memory as claimed in claim 1, wherein the third switch is a ninth transistor, the ninth transistor has a first terminal, a second terminal and a control terminal, wherein the first terminal of the ninth transistor receives the reference data, the second terminal is coupled to the first switch, the second switch and the data-transferring unit, and the control terminal receives the control signal.

8. The memory cell of the single-ended static random access memory as claimed in claim 1, wherein during writing data on the memory cell, the first switch or the second switch is turned on, and the third switch is turned on according to the control signal.

9. The memory cell of the single-ended static random access memory as claimed in claim 1, wherein during reading data on the memory cell, the first switch and the second switch are turned off, and the third switch is turned on according to the control signal.

10. The memory cell of the single-ended static random access memory as claimed in claim 1, wherein the voltage level of the reference data is equal to the voltage level of a reference ground.

* * * * *